United States Patent [19]
Kawamoto et al.

[11] Patent Number: 5,453,994
[45] Date of Patent: Sep. 26, 1995

[54] SEMICONDUCTOR TEST SYSTEM, SEMICONDUCTOR TEST METHOD, METHOD OF WIRING PATTERN FORMATION AND SEMICONDUCTOR INTEGRATED CIRCUIT

[75] Inventors: Kiyofumi Kawamoto, Takarazuka; Masahiko Yoshimoto, Itami, both of Japan

[73] Assignees: Mitsubishi Electric Engineering Company Limited; Mitsubishi Denki Kabushiki Kaisha, both of Tokyo, Japan

[21] Appl. No.: 91,261

[22] Filed: Jul. 15, 1993

[30] Foreign Application Priority Data

Jul. 21, 1992 [JP] Japan ................... 4-193977

[51] Int. Cl.⁶ ................................. G06F 11/00
[52] U.S. Cl. ............... 371/25.1; 324/751; 324/765; 364/579
[58] Field of Search ............... 364/579, 490; 371/25.1; 324/765, 767, 769, 751

[56] References Cited

U.S. PATENT DOCUMENTS

| | | | |
|---|---|---|---|
| 3,535,635 | 10/1970 | Okumura | 324/769 |
| 3,636,450 | 1/1972 | Griffin | 324/769 |
| 4,698,587 | 10/1987 | Burns et al. | 324/765 |
| 4,736,159 | 4/1988 | Shiragasawa et al. | 324/765 |
| 4,761,607 | 8/1988 | Shiragasawa et al. | 324/765 |
| 4,902,966 | 2/1990 | Brust et al. | 324/751 |
| 4,928,278 | 5/1990 | Otsuji et al. | 364/579 |
| 4,968,932 | 11/1990 | Baba et al. | 324/767 |
| 4,996,659 | 2/1991 | Yamaguchi | 364/579 |
| 5,334,540 | 8/1994 | Ishii | 324/765 |

FOREIGN PATENT DOCUMENTS

| | | |
|---|---|---|
| 0527337 | 2/1993 | European Pat. Off. |
| 4223129 | 5/1993 | Germany |

OTHER PUBLICATIONS

Proceedings International Test Conference 1900, pp. 1035–1039, M. Shinagawa, et al., "A Pico–Second External Electro–Optic Prober Using Laser Diodes".

*Primary Examiner*—Ellis B. Ramirez
*Attorney, Agent, or Firm*—Oblon, Spivak, McClelland, Maier & Neustadt

[57] ABSTRACT

The semiconductor test system comprises an OBIC measuring device (8) and a tester (5). The tester (5) transmits a test signal to an input pad (2a) of a semiconductor integrated circuit (1). In synchronization with this, the OBIC measuring device (8) irradiates drain regions (6) of the semiconductor integrated circuit (1) with a laser beam (7) one after another, to thereby detect the generation of the OBIC. An comparator (5c) in the tester (5) compares an output signal from an output pad (2b) of the semiconductor integrated circuit (1) and an OBIC detection signal from the OBIC measuring device (8) with expected values (5b).

14 Claims, 6 Drawing Sheets

| TEST CYCLE | OUTPUT PINS | | | | | | | DRAIN REGIONS | | | | | |
|---|---|---|---|---|---|---|---|---|---|---|---|---|---|
| | p1 | p2 | p3 | p4 | p5 | p6 | ··· | d1 | d2 | d3 | d4 | d5 | ··· |
| 0 | 0 | 0 | 0 | 0 | 0 | 0 | ··· | 0 | 0 | 0 | 0 | 0 | ··· |
| 10 | 1 | 0 | 0 | 0 | 0 | 0 | ··· | 0 | 0 | 0 | 0 | 0 | ··· |
| 20 | 1 | 1 | 0 | 0 | 1 | 0 | ··· | 1 | 0 | 1 | 0 | 1 | ··· |
| 30 | 1 | 0 | 0 | 1 | 0 | 0 | ··· | 0 | 0 | 1 | 0 | 0 | ··· |
| 40 | 1 | 0 | 1 | 0 | 0 | 1 | ··· | 0 | 1 | 1 | 1 | 0 | ··· |
| 50 | 1 | 1 | 0 | 1 | 0 | 1 | ··· | 0 | 0 | 1 | 0 | 0 | ··· |
| · | · | · | · | · | · | · | ··· | · | · | · | · | · | ··· |
| · | · | · | · | · | · | · | ··· | · | · | · | · | · | ··· |
| · | · | · | · | · | · | · | ··· | · | · | · | · | · | ··· |
| · | · | · | · | · | · | · | ··· | · | · | · | · | · | ··· |
| 500 | 1 | 1 | 1 | 0 | 0 | 0 | ··· | 0 | 0 | 1 | 0 | 1 | ··· |
| 510 | 0 | 1 | 0 | 1 | 0 | 0 | ··· | 0 | 1 | 1 | 0 | 1 | ··· |
| 520 | 0 | 1 | 1 | 0 | 1 | 0 | ··· | 0 | 0 | 1 | 0 | 0 | ··· |
| 530 | 0 | 0 | 0 | 0 | 0 | 0 | ··· | 0 | 1 | 1 | 1 | 0 | ··· |
| · | · | · | · | · | · | · | ··· | · | · | · | · | · | ··· |
| · | · | · | · | · | · | · | ··· | · | · | · | · | · | ··· |
| · | · | · | · | · | · | · | ··· | · | · | · | · | · | ··· |
| · | · | · | · | · | · | · | ··· | · | · | · | · | · | ··· |

*FIG. 2*

SEMICONDUCTOR TEST SYSTEM, SEMICONDUCTOR TEST METHOD, METHOD OF WIRING PATTERN FORMATION AND SEMICONDUCTOR INTEGRATED CIRCUIT

BACKGROUND OF THE INVENTION

1. Field of the Invention

The present invention relates to a semiconductor test system for testing a semiconductor integrated circuit, a semiconductor test method using the system, a semiconductor integrated circuit applicable to the test method and a method of forming a wiring pattern of the semiconductor integrated circuit.

2. Description of the Background Art

FIG. 6 is a schematic view of a conventional semiconductor test system. In FIG. 6, numeral 5 denotes a tester. The tester is connected to a plurality of probes 3 through connecting wires 4. Numeral 1 denotes a semiconductor integrated circuit to be tested by the tester 5. The semiconductor integrated circuit 1 comprises input pads 2a, output pads 2b and a power supply pad 2c serving as external terminals. These pads 2a, 2b and 2c are in contact with the probes 3, respectively.

In the semiconductor test system, an electric signal according to a test pattern is inputted to the input pad 2a from the tester 5, consequently an output signal corresponding to the function of the semiconductor integrated circuit 1 is outputted from the output pad 2b. The tester 5 detects the output signal and compares it with an expected value, thus testing the semiconductor integrated circuit 1.

FIG. 5 illustrates an example of a mask pattern of the semiconductor integrated circuit, such as a gate array, to be tested by the above conventional semiconductor test system. In FIG. 5, a gate 16 is disposed between a drain region 13 and a source region 14. Covering the drain region 13 and the source region 14, formed are a first layer metal wiring 10, a second layer metal wiring 11 and a third layer metal wiring 12. Numeral 15 denotes contact holes for interconnecting these wirings and regions.

In the conventional semiconductor test system, as described above, a test of the semiconductor integrated circuit depends on only the electric signal input to the input pads according to the test pattern, so that it is required to increase the number of the test patterns as the semiconductor integrated circuit becomes larger in scale and higher in integration. Moreover, when a degree of enlargement and integration is much higher, only the increase of the test patterns can not necessarily cause to improve a detection coverage, and there may be a case where detecting a fault is partly impossible. Providing a dedicated circuit for testing within the semiconductor integrated circuit is a reliable test method, but it is accompanied by the increases in space and cost.

SUMMARY OF THE INVENTION

The present invention is directed to a semiconductor test system for testing a semiconductor integrated circuit having external terminals. According to the present invention, the semiconductor test system comprises: an OBIC measuring device for irradiating at least one transistor active region in the semiconductor integrated circuit with an optical beam one after another to detect the generation of an optical beam induced current; a tester for transmitting a test signal to the semiconductor integrated circuit and receiving an output signal therefrom through the external terminals and simultaneously receiving another output signal from the OBIC measuring device to compare both the output signals with expected values, respectively; and a synchronizing means for synchronizing the tester and the OBIC measuring device.

When the test of the semiconductor integrated circuit is conducted by employing the semiconductor test system in accordance with the present invention, the OBIC measurement for the transistor active region makes it possible to detect a fault in a depth of the circuit which is difficult to find only by the input of the test signal delivered from the external terminal of the semiconductor integrated circuit. Therefore, its detection coverage may be improved, and the test can be carried out without decreasing its detection coverage even for a semiconductor integrated circuit of larger scale and higher integration. Moreover, as the number of the locations for the OBIC measurement is substantially increased, the test pattern to be applied to the external terminal of the semiconductor integrated circuit can be markedly simplified. It is not necessary to increase the number of the external terminals for applying the test pattern for the purpose of improving the detection coverage. These effects can be obtained by not only the simple combination of the OBIC measurement test using the laser beam and the output observation test using the input of the test pattern signal, but also the synchronization of the irradiation of the laser beam and the input of the test pattern signal. The simplification of the test pattern contributes to a reduction in testing time, thereby facilitating the test of the large-scale semiconductor integrated circuit.

Thus, according to the semiconductor test system of the present invention, it is possible to increase the detection coverage of the semiconductor integrated circuit without providing an exclusive circuit for detecting faults. Moreover, the semiconductor test system can prevent the test pattern to be applied to the external terminals from increasing, to thereby facilitate the test.

The present invention is also directed to a method of testing a semiconductor integrated circuit having external terminals. According to the present invention, the semiconductor test method comprises the steps of: (a) inputting a test signal to the semiconductor integrated circuit through the external terminals; (b) irradiating the at least one transistor active region in the semiconductor integrated circuit with an optical beam one after another in synchronization with the step (a) of inputting the test signal; (c) detecting an output signal of the semiconductor integrated circuit which is generated in response to the inputted test signal through the external terminals while detecting the generation of an optical beam induced current in response to the irradiated optical beam; and (d) comparing a detection result in the step (c) with an expected value.

Because of the function of the semiconductor test system described above, the semiconductor test method in accordance with the present invention makes it possible to detect faults even for a semiconductor integrated circuit of larger scale and higher integration at a high detection ratio.

Thus, according to the semiconductor test method of the present invention, even a large scale integrated circuit can be tested without decreasing its detection coverage. Moreover, it is possible to easily inspect the depth of the circuit where the fault detection is hard to conduct by only the test using the external terminals.

The present invention is further directed to a method of forming a wiring pattern of a semiconductor integrated circuit to be tested by the above semiconductor test method. According to the present invention, the method of forming a wiring pattern of the semiconductor integrated circuit comprises steps of: (e) determining transistor active regions to be tested in the semiconductor integrated circuit; and (f) forming a wiring pattern so that a wiring which is out of contact with the transistor active regions to be tested might avoid passing thereover.

In the method of forming a wiring pattern of the semiconductor integrated circuit in accordance with the present invention, the wiring pattern is so formed as to avoid passing over the transistor active regions to be tested (i.e. to be irradiated with the optical beam), to thereby obtain a large scale semiconductor integrated circuit having a high detection coverage.

According to the method of forming a wiring pattern of the semiconductor integrated circuit, the transistor active regions to be tested are not covered with the unnecessary wiring, so that the semiconductor integrated circuit having a high detection coverage can be obtained. Also, it is possible to provide the semiconductor integrated circuit in which the depth can be tested with ease.

Moreover, the wiring pattern formation can be efficiently performed by using a CAD.

The present invention is still directed to a semiconductor integrated circuit to be tested by the above semiconductor test method. According to the present invention, the semiconductor integrated circuit is characterized by that the wiring which is out of contact with the at least one transistor active region to be tested is not formed over the transistor active region.

In the semiconductor integrated circuit in accordance with the present invention, the transistor active region to be irradiated with the optical beam is not covered with the unnecessary wiring, so that it can be accomplished with ease to perform the OBIC measurement by irradiating the transistor active region with the optical beam and to detect faults in the depth of the circuit, thereby ensuring the enlargement and higher integration without decreasing the detection coverage.

Thus, the semiconductor integrated circuit of the present invention has a feature that faults in the depth of its internal circuit can be detected directly by the OBIC measurement of the transistor active regions since the transistor active regions are not covered with the unnecessary wiring. Therefore, the semiconductor integrated circuit can become larger in scale and higher integration while maintaining a very high detection coverage, thereby being a more reliable product.

Accordingly, an object of the present invention is to improve the detection coverage of the semiconductor integrated circuit without increasing the test pattern or providing an exclusive circuit for testing, to thereby facilitate the test of the semiconductor integrated circuit.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 shows an example of expected values in a test of a semiconductor integrated circuit performed by the semiconductor test system in accordance with the present invention;

DESCRIPTION OF THE PREFERRED EMBODIMENTS

Figure 1:
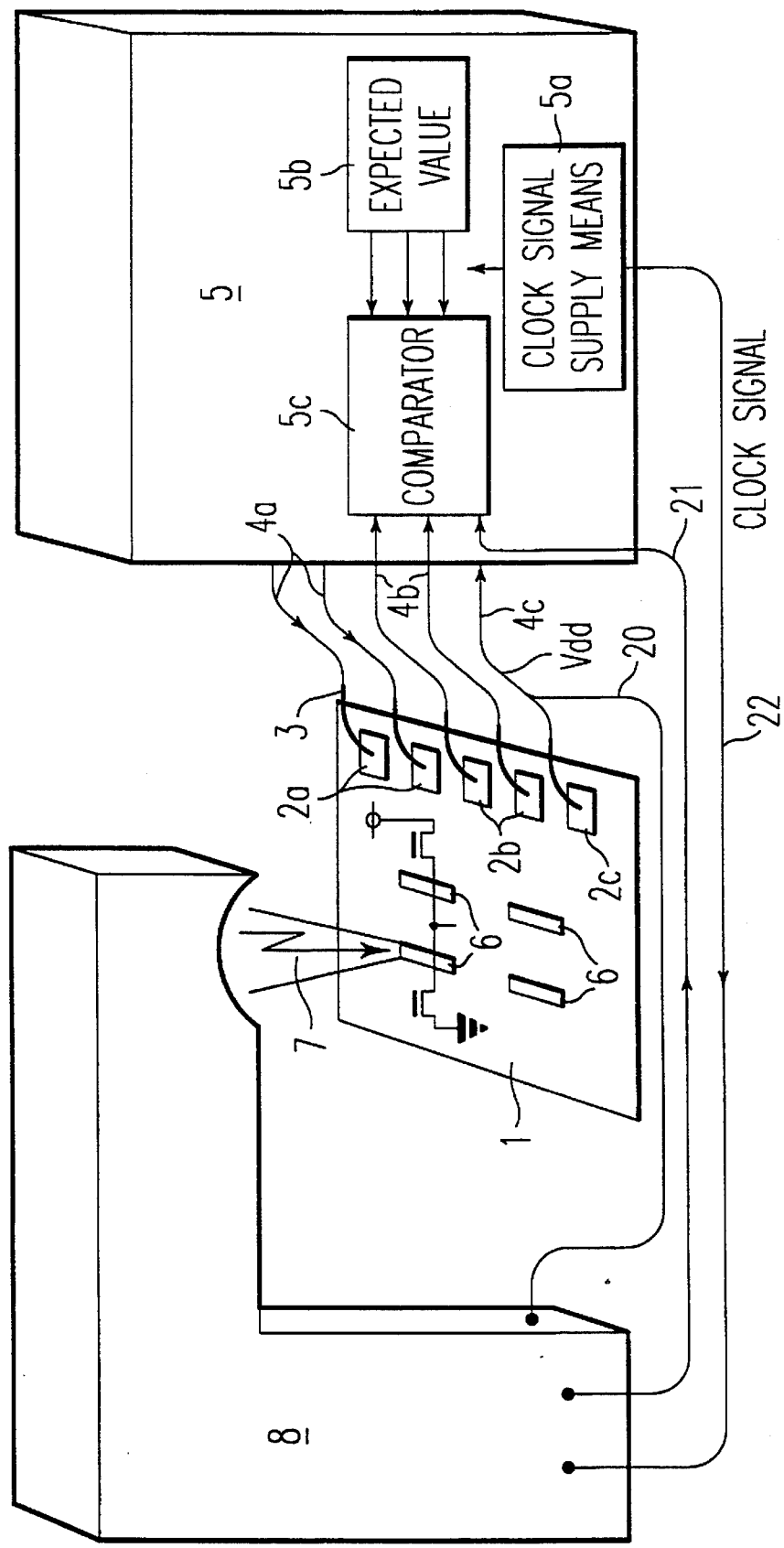
FIG. 1 is a schematic view of a semiconductor test system in accordance with a preferred embodiment of the present invention.

FIG. 1 is a schematic view of a semiconductor test system in accordance with a preferred embodiment of the present invention. The semiconductor test system comprises an OBIC (Optical beam Induced Current) measuring device 8 and a tester 5.

The OBIC measuring device 8 has a function of irradiating a plurality of transistor active regions of the semiconductor integrated circuit 1 under test such as a plurality of drain regions 6 of a MOS transistor one after another with a laser beam 7.

The semiconductor integrated circuit 1 comprises input pads 2a, output pads 2b and a power supply pad 2c serving as external terminals. The tester 5 is connected to probes 3 through connecting wires 4a, 4b and 4c. A probe 3 connecting with the connecting wire 4a is in contact with the input pad 2a of the semiconductor integrated circuit 1, another probe 3 connecting with the connecting wire 4b is in contact with the output pad 2b of the semiconductor integrated circuit 1, and sill another probe 3 connecting with the connecting wire 4c is in contact with the power supply pad 2c of the semiconductor integrated circuit 1. The connecting wire 4c for conducting supply voltage Vdd is connected with one end of the connecting wire 20, the other end of which is connected with the OBIC measuring device 8.

The tester 5 comprises a clock signal supply means 5a for supplying a clock signal on which the operation timing depends. A connecting wire 22 is so provided between the tester 5 and the OBIC measuring device 8 as to transmit the clock signal from the clock signal supply means 5a to the OBIC measuring device 8 in order to synchronize the irradiation of the laser beam 7 by the OBIC measuring device 8 with the operation of the tester 5.

The tester 5 further comprises an expected value memory, for example, for providing an expected value 5b and a comparator 5c. The comparator 5c compares an output signal from an output pad 2b of the semiconductor integrated circuit 1 and an OBIC detection signal transmitted through a connecting wire 21 from the OBIC measuring device 8 with the expected value 5b.

Next, the operation of the semiconductor test system will be described. In the semiconductor test system, the signal outputted from the semiconductor integrated circuit 1 in response to a test signal delivered from the tester 5 and the OBIC detection signal in response to the laser beam 7 applied to the drain region 6 of the semiconductor integrated circuit 1 by the OBIC measuring device 8 are compared with the expected value 5b in the tester 5.

First, the test signal according to the predetermined test pattern is inputted to the input pad 2a of the semiconductor integrated circuit 1 through the connecting wire 4a and the probe 3 from the tester 5. In response to the input of the test signal, the output signal corresponding to the function of the semiconductor integrated circuit 1 is outputted from the output pad 2b. The output signal is transmitted to the comparator 5c in the tester 5 through the probe 3 and the connecting wire 4b.

On the other hand, at the same time with the operation of inputting the test signal to the semiconductor integrated circuit 1 from the tester 5, the laser beam 7 from the OBIC measuring device 8 is applied one after another to a plurality of predetermined drain regions 6 in the internal circuit of the semiconductor integrated circuit 1. The irradiation of the laser beam 7 is performed in synchronization with the application of the test signal so that the measurement of the predetermined internal circuit of the semiconductor integrated circuit 1 may be executed simultaneously with the measurement of the input and output pads 2a, 2b. For the synchronization, the clock signal is transmitted from the clock signal supply means 5a in the tester 5 to the OBIC measuring device 8 through the connecting wire 22. The OBIC measuring device 8 performs the irradiation of the laser beam 7 at a timing as a function of the clock signal. When an optical beam induced current is generated by the irradiation of the laser beam 7 in the interior of the semiconductor integrated circuit 1, it allows the power supply voltage Vdd across the power supply pad 2c and the connecting wire 4c to change. The OBIC measuring device detects the change of the power supply voltage Vdd through the connecting wire 20, thus detecting the generation of the optical beam induced current. Then, the OBIC detection signal indicating whether the optical beam induced current is generated or not is transmitted to the comparator 5c in the tester 5 from the OBIC measuring device 8 through the connecting wire 21.

The comparator 5c of the tester 5 compares the output signal from the semiconductor integrated circuit 1 and the OBIC detection signal from the OBIC measuring device 8 with the expected values 5b, respectively.

For instance, the expected values of the OBIC detection signal will be shown in the below table 1 in the case where the irradiation of the laser beam may be performed on the drain regions of an n-channel transistor or a p-channel transistor of a CMOS inverter.

TABLE 1

| Irradiation Point of Laser Beam | Gate Voltage Level | |
| --- | --- | --- |
| | H | L |
| N-channel Drain | OBIC is not detected (0) | OBIC is detected (1) |
| P-channel Drain | OBIC is detected (1) | OBIC is not detected (0) |

Although FIG. 1 illustrates only two input pads 2a, two output pads 2b and four drain regions 6, the actual number of input terminals, output terminals and drain regions to be measured is generally much larger. FIG. 2 shows an example of test cycle and expected values in such a case. On the left column are shown the expected values of the output signals from the respective output pads 2b (output pins) in response to the test signals while on the right column are those of the OBIC detection signals in response to the laser beams 7 applied to respective drain region 6. The symbols p1~p6 . . . each specify the output pins (pads) to be measured while the symbols d1~d5 . . . each specify the drain regions 6 to be irradiated with the laser beam 7 (i.e., the drain regions to be measured). Since the irradiation of the laser beam 7 is performed for the drain regions 6 one after another, the measurement of the expected values of the OBIC detection signals is executed for each of drain regions 6 one by one. Although the test cycle is shown in every ten, it is not limited to that.

Thus, in the preferred embodiment, the measurement of the expected values of the OBIC for the drain regions 6 in the internal circuit of the semiconductor integrated circuit 1 is performed simultaneously as well as the measurement of the expected values of the input and output pads 2a, 2b. Therefore, the fault detection of the internal circuit is accomplished with case, which is hard to conduct only by the measurement of the input and output pads 2a, 2b.

Figure 3:
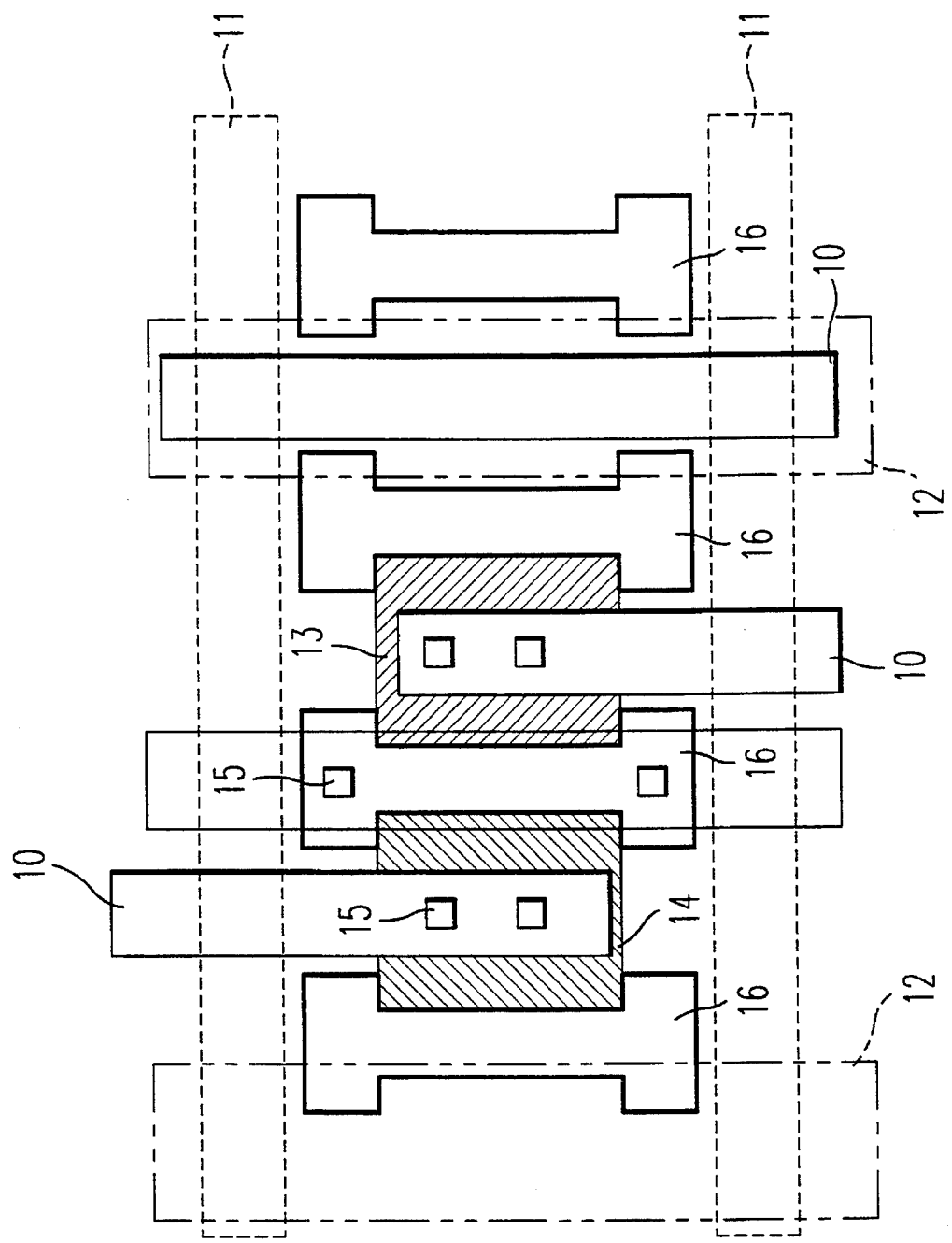
FIG. 3 illustrates a wiring pattern of the semiconductor integrated circuit applicable to the test performed by the semiconductor test system in accordance with the present invention.
Figure 5:
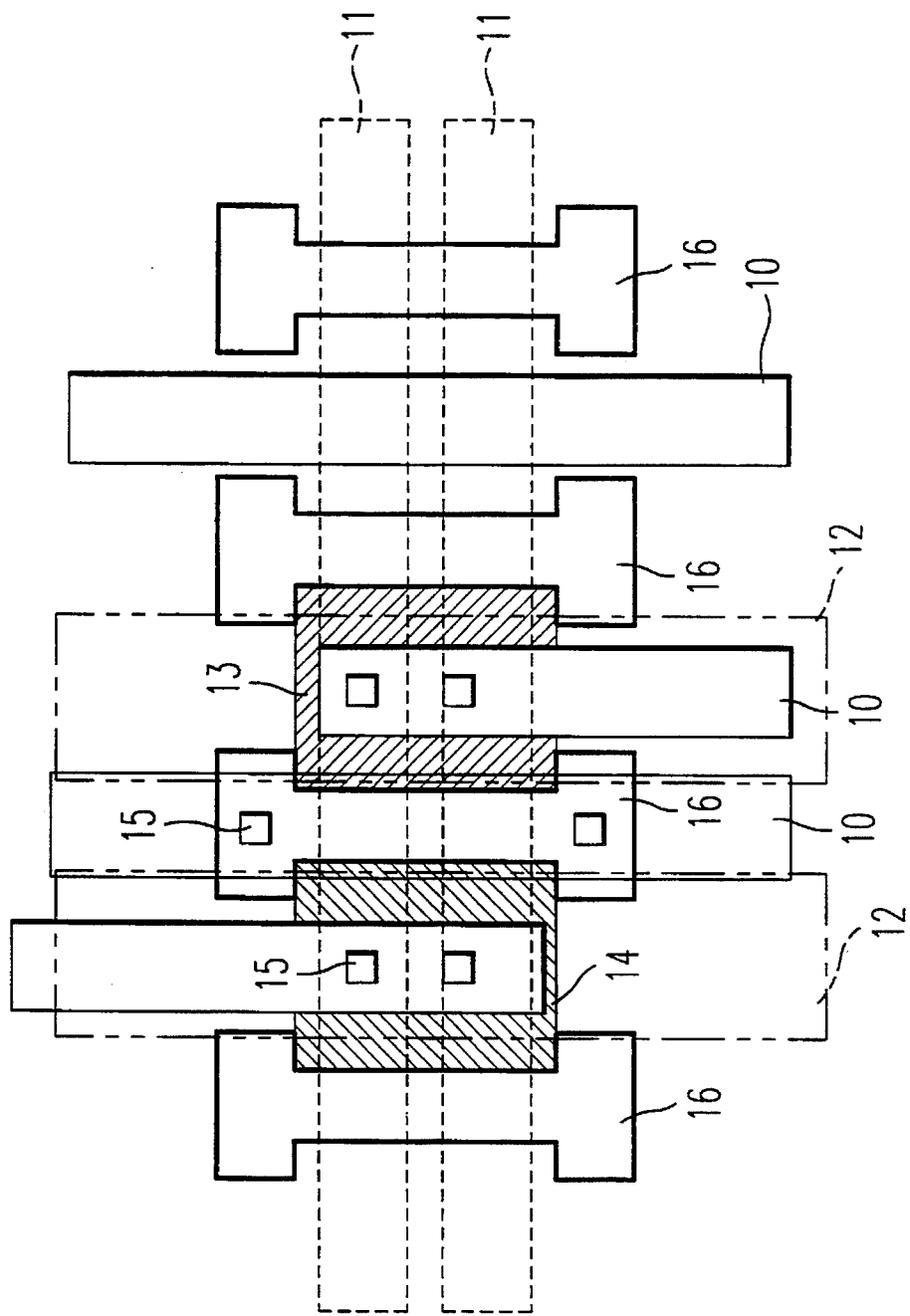
FIG. 5 illustrates a wiring pattern of a conventional semiconductor test system.
Figure 6:
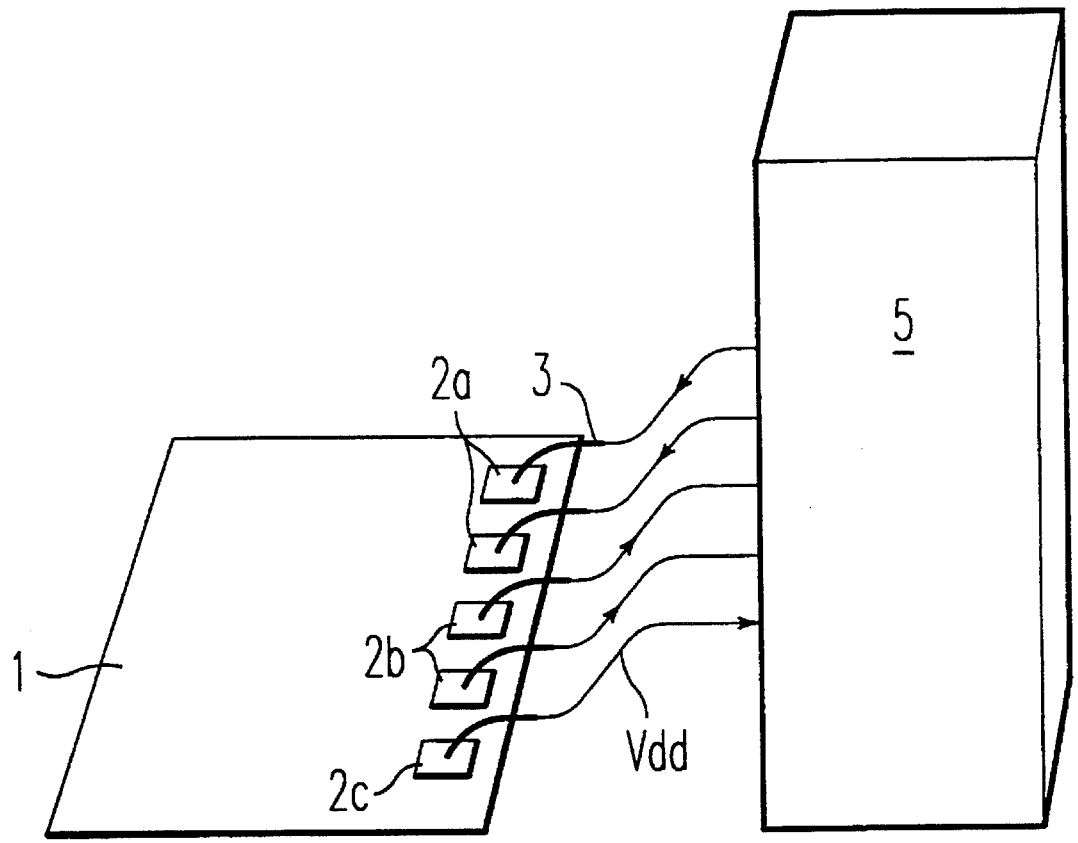
FIG. 6 is a schematic view of the conventional semiconductor test system.

Next, FIG. 3 illustrates an example of a wiring pattern of the semiconductor integrated circuit applicable to the semiconductor test system in accordance with the present invention. In this wiring pattern, a drain region 13 to be measured and a source region 14 corresponding to the drain region 13 are not provided thereover with a second layer metal wiring 11 and a third layer metal wiring 12 which are out of contact with the drain and source regions 13, 14, unlike the conventional pattern of FIG. 5 described before. The second layer metal wiring 11 and the third layer metal wiring 12 are so formed as not to pass over the drain region 13 and the source region 14 while being shifted sideways, as is evident in comparison of FIG. 3 and FIG. 5. A first layer metal wiring 10 can not be shifted sideways since it has a necessity of being in contact with the drain region 13 and the source region 14. Another aspects of configuration of the wiring pattern are the same as those of conventional one shown in FIG. 5.

In the semiconductor integrated circuit of FIG. 3, no unnecessary wiring is formed over the drain region 13 to be measured. Therefore, it is possible to irradiate the drain region 13 with the laser beam easily and surely and to certainly detect the fault location even in a semiconductor integrated circuit of high integration and large scale.

In designing the semiconductor integrated circuit, following the steps of designing a circuit connection and determining drain regions to be measured for a test of the internal circuit, a step may be executed in which wirings are so formed by the master slice, for example, on a master as not to pass over the drain regions.

Figure 4:
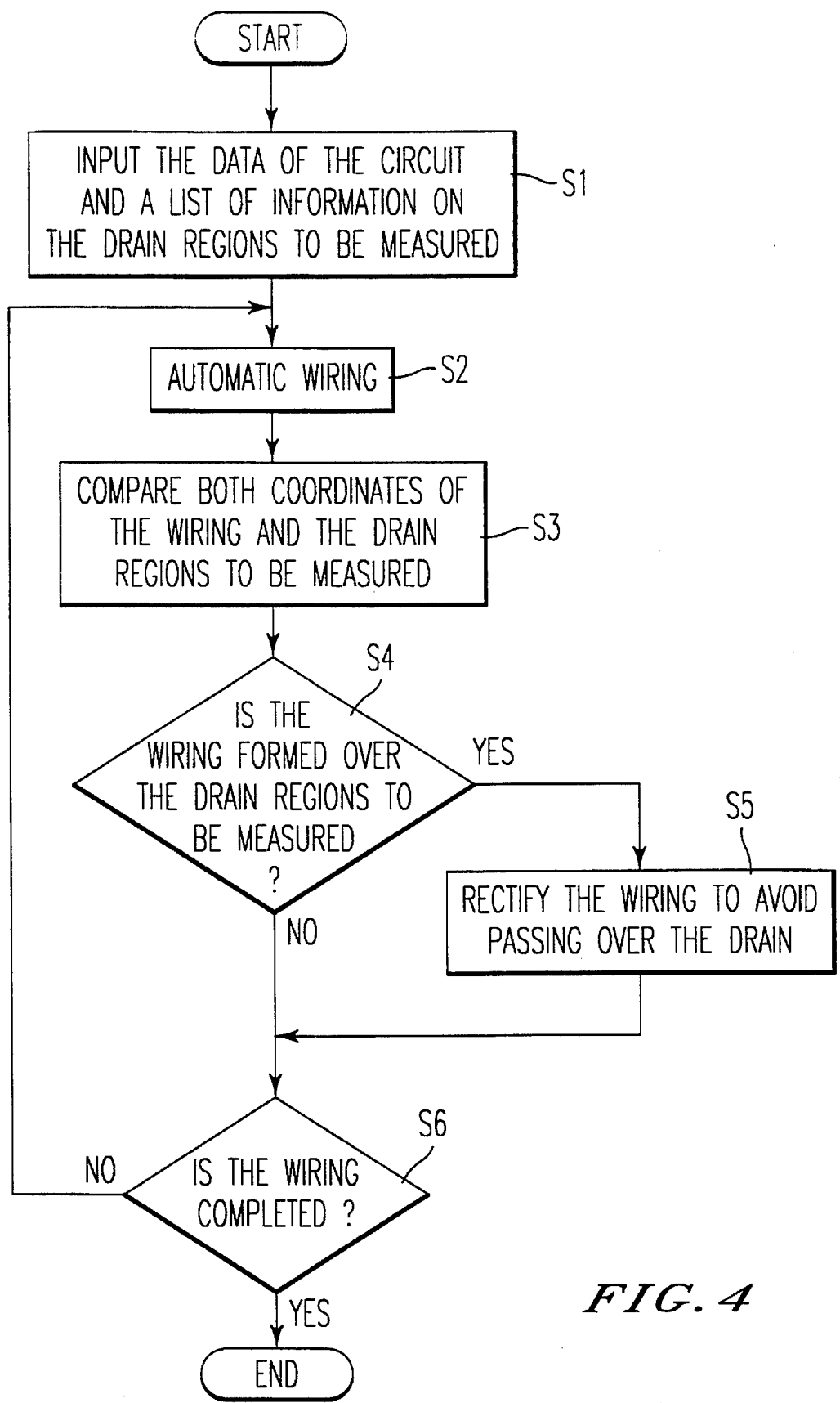
FIG. 4 is a flow chart showing a method of forming the wiring pattern of the semiconductor integrated circuit applicable to the test performed by the semiconductor test system in accordance with the preferred embodiment of the present invention.

Preferably, automatic wiring is performed on the master so as not to pass over the drain regions to be measured with a CAD, to which data of the circuit connection and a list of information on the drain regions to be measured are inputted previously. The method will be described below in reference with the flow chart of FIG. 4. First, the data of the circuit connection and a list of information on the drain regions to be measured are inputted to the CAD (Step S1). Next, automatic wiring is performed in accordance with the data of the circuit connection (Step S2). Following this, both coordinates of the wiring and the drain regions to be measured are compared with each other (Step S3). By the comparison, a decision is made as to whether or not any unnecessary wiring, i.e. any wiring which is out of contact with the drain regions to be measured, is formed over the drain regions to be measured (Step S4). If any unnecessary wiring is formed over the drain regions to be measured, the wiring formation is rectified so as to avoid passing over the drain regions to be measured (Step S5). Otherwise nothing is done. Then a decision is made as to whether or not the wiring is completed (Step S6). If the wiring is completed, the processing is over, and otherwise it returns to the Step S2. Thus, the automatic formation of the wiring pattern may be carried out in the semiconductor integrated circuit applicable to the semiconductor test system in accordance with the present invention.

While the invention has been shown and described in detail, the foregoing description is in all aspects illustrative and not restrictive. It is therefore understood that numerous modifications and variations can be devised without departing the scope of the invention.

We claim:

1. A semiconductor test system for testing a semiconductor integrated circuit having external terminals, comprising:

an OBIC measuring device for irradiating at least one transistor active region in said semiconductor integrated circuit with an optical beam one after another to detect the generation of an optical beam induced current;

a tester for transmitting a test signal to said semiconductor integrated circuit and receiving an output signal therefrom through said external terminals and simultaneously receiving another output signal from said OBIC measuring device to compare both said output signals with expected values, respectively; and a synchronizing means for synchronizing said tester and said OBIC measuring device.

2. A semiconductor test system of claim 1, wherein said synchronizing means is a clock signal common to said tester and said OBIC measuring device.

3. A semiconductor test system of claim 1, wherein said tester is provided with a plurality of probes, each of said probes is connected to said tester through a connecting wire by one end and is in contact with each of said external terminals of said semiconductor integrated circuit by the other end.

4. A semiconductor test system of claim 1, wherein said tester comprises a comparator for comparing both said output signals with said expected values.

5. A semiconductor test system of claim 1, wherein said transistor active region is a drain region.

6. A method of testing a semiconductor integrated circuit having external terminals, comprising the steps of:

(a) inputting a test signal to said semiconductor integrated circuit through said external terminals;

(b) irradiating at least one transistor active region in said semiconductor integrated circuit with an optical beam one after another simultaneously and in synchronization with said step (a) of inputting said test signal;

(c) detecting an output signal of said semiconductor integrated circuit which is generated in response to said inputted test signal through said external terminals while detecting the generation of an optical beam induced current in response to said irradiated optical beam; and (d) comparing a detection result in said step (c) with an expected value.

7. A semiconductor test method of claim 6, wherein said step (b) comprises a step of synchronizing the irradiation of said optical beam and the input of said test signal by a common clock signal.

8. A method of semiconductor test of claim 6, wherein said transistor active region is a drain region.

9. A method of forming a wiring pattern of a semiconductor integrated circuit to be tested by the semiconductor test method of claim 6, comprising the steps of:

(e) determining transistor active regions to be tested in said semiconductor integrated circuit; and (f) forming a wiring pattern so that a wiring which is out of contact with said transistor active regions to be tested might avoid passing thereover.

10. A method of forming a wiring pattern of a semiconductor integrated circuit of claim 9, wherein said transistor active regions are drain regions.

11. A method of forming a wiring pattern of a semiconductor integrated circuit of claim 9, wherein said step (e) comprises a step of inputting to a CAD a list of information of said transistor active regions to be tested; and said step (f) comprises a step of performing automatic wiring with said CAD so as to avoid passing over said transistor active regions to be tested.

12. A method of forming a wiring pattern of a semiconductor integrated circuit of claim 11, wherein said step (f) comprising a step of rectifying a wiring formation so as to avoid passing over said transistor active regions to be tested after once performing automatic wiring regardless of said transistor active regions to be tested.

13. A semiconductor integrated circuit to be tested by the semiconductor test method of claim 6, characterized by that said wiring which is out of contact with said at least one transistor active region to be tested is not formed over said transistor active region.

14. A semiconductor integrated circuit of claim 13, wherein said transistor active region is a drain region.

* * * * *